(12) United States Patent
Zha

(10) Patent No.: US 11,977,292 B2
(45) Date of Patent: May 7, 2024

(54) COLOR FILTER SUBSTRATE, DISPLAY PANEL, AND DISPLAY DEVICE

(71) Applicant: WUHAN CHINA STAR OPTOELECTRONICS TECHNOLOGY CO., LTD., Wuhan (CN)

(72) Inventor: Guowei Zha, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/264,816

(22) PCT Filed: Oct. 30, 2020

(86) PCT No.: PCT/CN2020/125228
§ 371 (c)(1),
(2) Date: Apr. 14, 2023

(87) PCT Pub. No.: WO2021/248783
PCT Pub. Date: Dec. 16, 2021

(65) Prior Publication Data
US 2023/0236453 A1    Jul. 27, 2023

(30) Foreign Application Priority Data
Jun. 8, 2020 (CN) .................. 202010513906.9

(51) Int. Cl.
*G02F 1/1333* (2006.01)
*G02F 1/1335* (2006.01)
(Continued)

(52) U.S. Cl.
CPC .. *G02F 1/133516* (2013.01); *G02F 1/133357* (2021.01); *G02F 1/136286* (2013.01);
(Continued)

(58) Field of Classification Search
CPC ...................................... G02F 1/1362
See application file for complete search history.

(56) References Cited

U.S. PATENT DOCUMENTS

2014/0091337 A1* 4/2014 Ooyabu ............. H05K 3/284
257/99
2015/0346531 A1* 12/2015 Ishigaki ............. G02F 1/13338
445/24
(Continued)

FOREIGN PATENT DOCUMENTS

CN   107230685   * 10/2017   ............. H01L 27/15
CN   107230685 A   10/2017
(Continued)

OTHER PUBLICATIONS

International Search Report in International application No. PCT/CN2020/125228, dated Mar. 11, 2021.
(Continued)

*Primary Examiner* — Sang V Nguyen
(74) *Attorney, Agent, or Firm* — PV IP PC; Wei Te Chung; Zhigang Ma

(57) ABSTRACT

The present disclosure provides a color filter substrate, a display panel, a display device. The color filter substrate comprises a first pixel area and a second pixel area adjacent to the first pixel area. The color filter substrate further comprises a base; a plurality of micro light emitting diode (Micro LED) light-emitting units disposed on the base corresponding to the first pixel area; a planarization layer disposed on the Micro LED light-emitting units and the base; and color resists disposed on the planarization layer corresponding to the second pixel area. The present disclosure solves the problem that optical sensors cannot overlap optical display spatially in LCD screens.

16 Claims, 5 Drawing Sheets

(51) Int. Cl.
*G02F 1/1362* (2006.01)
*H01L 25/16* (2023.01)
*H01L 33/58* (2010.01)
*G02F 1/13357* (2006.01)

(52) U.S. Cl.
CPC ............ *H01L 25/167* (2013.01); *H01L 33/58* (2013.01); *G02F 1/133512* (2013.01); *G02F 1/133617* (2013.01); *G02F 2201/44* (2013.01); *G02F 2201/50* (2013.01); *G02F 2201/52* (2013.01)

(56) References Cited

U.S. PATENT DOCUMENTS

| | | | |
|---|---|---|---|
| 2016/0328058 A1* | 11/2016 | Peng | H01L 27/124 |
| 2018/0004037 A1* | 1/2018 | Park | G02F 1/136286 |
| 2018/0033969 A1* | 2/2018 | Kamijo | H10K 59/131 |
| 2019/0339570 A1* | 11/2019 | Chen | H10K 59/128 |
| 2021/0356788 A1* | 11/2021 | Zha | G02F 1/133603 |

FOREIGN PATENT DOCUMENTS

| | | |
|---|---|---|
| CN | 110275340 A | 9/2019 |
| CN | 110456550 A | 11/2019 |
| CN | 110632789 A | 12/2019 |
| CN | 110794604 A | 2/2020 |
| CN | 111081730 A | 4/2020 |
| CN | 111258101 A | 6/2020 |
| CN | 111596484 A | 8/2020 |
| CN | 111596485 A | 8/2020 |
| CN | 111708196 A | 9/2020 |
| CN | 212276178 U | 1/2021 |

OTHER PUBLICATIONS

Written Opinion of the International Search Authority in International application No. PCT/CN2020/125228, dated Mar. 11, 2021.

* cited by examiner

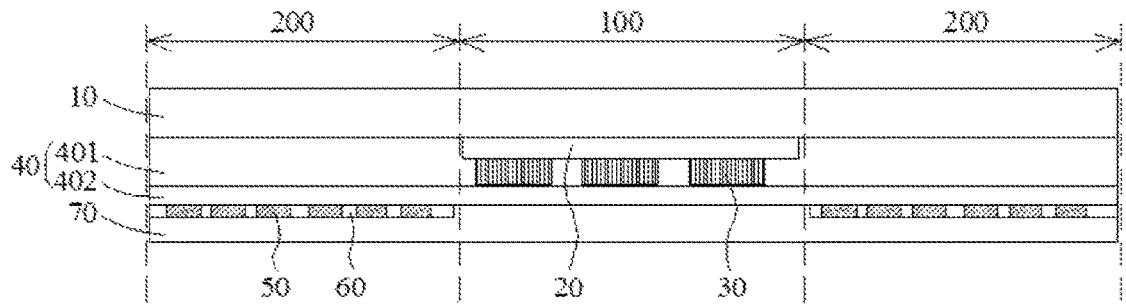

FIG. 4

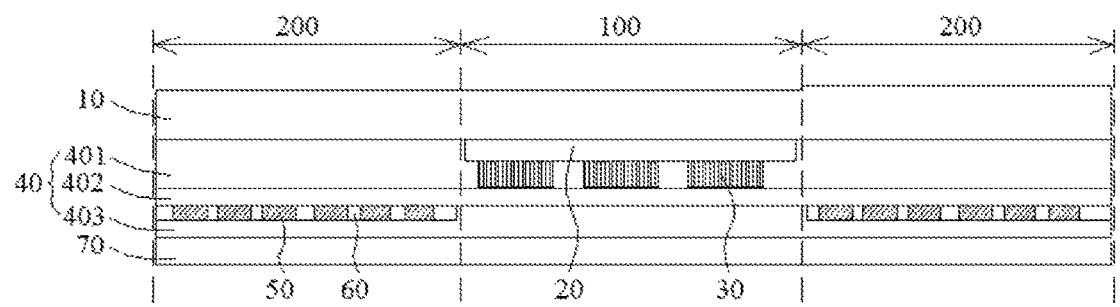

FIG. 5

```
┌─────────────────────────────────────────────────────────────────┐
│ Forming a first driving circuit and a first welding electrode   │── S1
│ electrically connected with the first driving circuit in the    │
│ first pixel area of the base, wherein the first driving circuit │
│ comprises scan lines extending in a horizontal direction and    │
│ data line extending in a vertical direction, and the first      │
│ welding electrode is located within a sub-pixel area defined by │
│ adjacent two of the scan lines and adjacent two of the data lines│
└─────────────────────────────────────────────────────────────────┘
                              ▼
┌─────────────────────────────────────────────────────────────────┐
│ Transferring the Micro LED light-emitting units to the first    │── S2
│ pixel area of the base by printing, and electrically binding a  │
│ second welding electrode on the Micro LED light-emitting units  │
│ and the first welding electrode                                 │
└─────────────────────────────────────────────────────────────────┘
                              ▼
┌─────────────────────────────────────────────────────────────────┐
│ Preparing a planarization layer on the Micro LED light-emitting │── S3
│ units and the base                                              │
└─────────────────────────────────────────────────────────────────┘
                              ▼
┌─────────────────────────────────────────────────────────────────┐
│ Preparing color resists on the planarization layer, wherein the │── S4
│ color resists are formed within a second pixel area adjacent to │
│ the first pixel area                                            │
└─────────────────────────────────────────────────────────────────┘
```

FIG. 6

COLOR FILTER SUBSTRATE, DISPLAY PANEL, AND DISPLAY DEVICE

FIELD OF INVENTION

The present disclosure relates to a display technical field, and specifically, to a color filter substrate, a display panel, and a display device.

BACKGROUND OF INVENTION

With the popularity of full screens and consumers' pursuit of integration of the device, under-screen sensing technology has become the focus of development in the field of small and medium-sized displays. Since liquid crystal display (LCD) screens belong to passive luminescence of entire backlight, optical sensors cannot overlap optical display spatially, which limits the development of the LCD screens to full screens.

On the contrary, OLED screens use OLED pixels to emit light actively. Compared with LCD screens, the OLED screens have the advantages of high contrast, lightness and thinness, flexibility, and foldability. Furthermore, based on the characteristics of the OLED screens that do not require backlighting, the OLED screens can be very compatible with the current optical sensors, so that in-plane optical sensing technology has become the "unique advantage" of the current OLED screen, which switches the OLED screen between a display mode and an imaging mode without a digging area formed by digging solutions for the current LCD screen, which makes the digging area unable to display.

Therefore, with the current pursuit of the optimal full screen, the LCD screens with low-cost advantages appear to be in a precarious situation. How to make the LCD screens meet the current extreme demand for full screens has become an urgent problem to be solved.

SUMMARY OF DISCLOSURE

Technical Problem

The present disclosure provides a color filter substrate, a display panel, and a display device capable of solving the problem that optical sensors cannot overlap optical display spatially in conventional LCD screens, so that the LCD screens cannot meet people's extreme requirement of full-screen display.

Solution to Technical Problem

Technical Solution

For solving above problems, the present disclosure provides technical solutions as below:

The present disclosure provides a color filter substrate, comprising a first pixel area and a second pixel area adjacent to the first pixel area, wherein the color filter substrate comprises:

a base;

a plurality of micro light emitting diode (Micro LED) light-emitting units disposed on the base corresponding to the first pixel area, wherein a transparent area is disposed between the Micro LED light-emitting units;

a planarization layer disposed on the Micro LED light-emitting units and the base; and color resists disposed on the planarization layer corresponding to the second pixel area.

In the color filter substrate of the present disclosure, a surface of the planarization layer away from the base is a flat surface, the color filter substrate further comprises a protection layer disposed on the color resists and the planarization layer, and a surface of the protection layer away from the base is a flat surface.

In the color filter substrate of the present disclosure, the planarization layer comprises a first sub-planarization layer and a second sub-planarization layer, the first sub-planarization layer is filled between adjacent two of the Micro LED light-emitting units, the second sub-planarization layer is disposed on the Micro LED light-emitting units and the first sub-planarization layer, a surface of the second sub-planarization layer away from the Micro LED light-emitting units is a flat surface.

In the color filter substrate of the present disclosure, a side of the color resists away from the base is provided with a third sub-planarization layer, a surface of the third sub-planarization layer away from the base is a flat surface, and the protection layer is disposed on the surface of the third sub-planarization layer.

In the color filter substrate of the present disclosure, a thickness of the planarization layer ranges from 3 microns ($\mu m$) to 100 microns ($\mu m$).

In the color filter substrate of the present disclosure, a thickness of a portion of the planarization layer corresponding to the Micro LED light-emitting units is smaller than a thickness of a portion of the planarization layer not corresponding to the Micro LED light-emitting units.

In the color filter substrate of the present disclosure, a thickness of the planarization layer corresponding to the Micro LED light-emitting units ranges from 2 microns ($\mu m$) to 80 microns ($\mu m$).

In the color filter substrate of the present disclosure, a transmittance of the planarization layer is greater than or equal to 70%.

In the color filter substrate of the present disclosure, the color filter substrate further comprises a first driving circuit which corresponds to the first pixel area and is disposed on a surface of the base facing the Micro LED light-emitting units, and the Micro LED light-emitting units are electrically connected with the first driving circuit.

In the color filter substrate of the present disclosure, the first driving circuit comprises scan lines extending in a horizontal direction and data lines extending in a longitudinal direction, adjacent two of the scan lines and adjacent two of the data lines define a sub-pixel area, and an area of an orthographic projection of each of the Micro LED light-emitting units projected on the base is smaller than an area of the sub-pixel area.

In the color filter substrate of the present disclosure, the color filter substrate further comprises a first welding electrode electrically connecting the first driving circuit, and the first welding electrode is located within the sub-pixel area.

In the color filter substrate of the present disclosure, an area of an orthographic projection of each of the Micro LED light-emitting units projected on the base ranges from 10% to 50% of an area of the sub-pixel area; the Micro LED light-emitting units comprise a red light-emitting unit, a green light-emitting unit, and a blue light-emitting unit.

In the color filter substrate of the present disclosure, the red light-emitting unit comprises a blue light-emitting unit and a color conversion layer disposed on the blue light-emitting unit, and the green light-emitting unit comprises a blue light-emitting unit and a color conversion layer on the blue light-emitting unit, and the color conversion layer is a quantum dot film or a fluorescent powder.

In the color filter substrate of the present disclosure, the first driving circuit further comprises thin film transistors, each of the Micro LED light-emitting units electrically connects the corresponding scan lines and the corresponding data lines, respectively, through the corresponding thin film transistors.

In the color filter substrate of the present disclosure, the first pixel area is a Micro LED display area, and the second pixel area is a liquid crystal display area.

In the color filter substrate of the present disclosure, the color filter substrate further comprises a black matrix disposed on the planarization layer corresponding to the second pixel area, and located between adjacent two of the color resists.

In the color filter substrate of the present disclosure, a protection layer is disposed on the color resists and the black matrix.

In the color filter substrate of the present disclosure, the protection layer is disposed within the first pixel area and the second pixel area, and a surface of the protection layer away from the base is a flat surface.

The present disclosure further provides a display panel, comprising the abovementioned color filter substrate.

The present disclosure further provides a display device, comprising the abovementioned color filter substrate.

BENEFICIAL EFFECT OF DISCLOSURE

Beneficial Effect

The beneficial effect of the present disclosure is that the color filter substrate, the display panel, and the display device use a micro light emitting diode (Micro LED) display technology in combination with a liquid crystal display (LCD) display technology to achieve an optimal LCD full-screen display, and make full use of the advantages of the Micro LED light-emitting units, which are small in size and can improve the permeability of the panel, to realize the in-screen sensor integration. The present disclosure achieves a seamless connection of lateral and vertical space in a Micro LED display technology and an LCD display technology, thereby solving the problem that the optical sensors cannot overlap the optical display spatially in conventional LCD screens, so that the LCD screens cannot meet people's extreme requirement of full-screen display.

BRIEF DESCRIPTION OF DRAWINGS

Description of Drawings

The technical solutions in embodiments of the present disclosure will be described clearly in conjunction with the drawings in the embodiments of the present disclosure, rendering the technical solutions of the present disclosure and other beneficial effects apparent.

Figure 1:
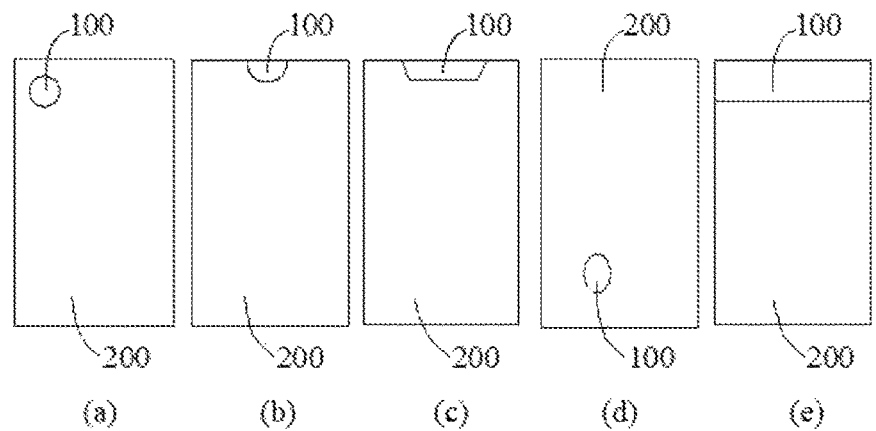

FIG. 1 shows top views of various types of color filter substrates according to embodiments of the present disclosure.

Figure 2:
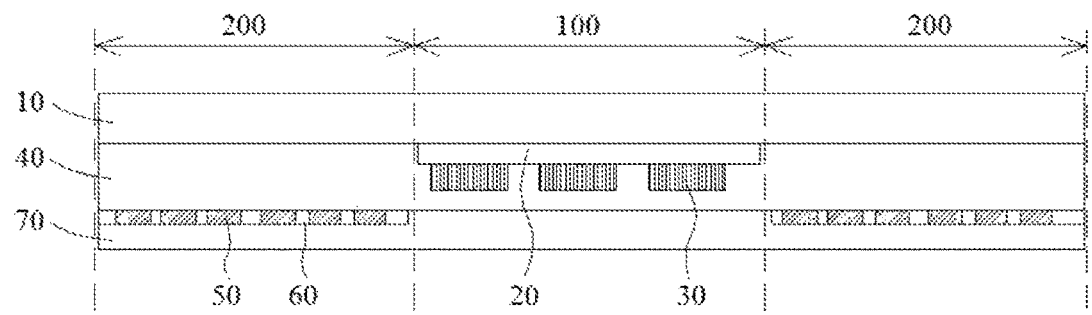

FIG. 2 is a cross-sectional view of a color filter substrate according to one embodiment of the present disclosure.

Figure 3:
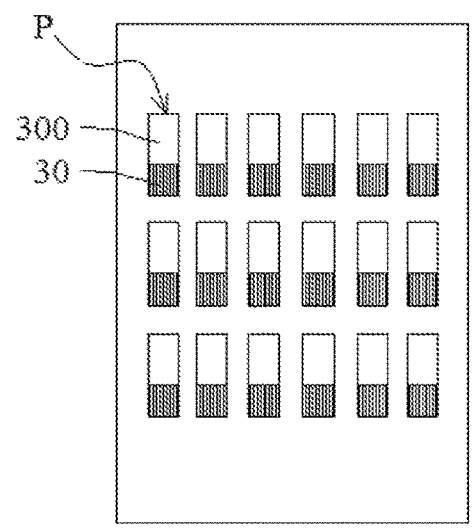

FIG. 3 is a schematic view of a color filter substrate having Micro LED light-emitting units according to one embodiment of the present disclosure.

FIG. 4 is a structural schematic view of a color filter substrate according to another embodiment of the present disclosure.

FIG. 5 is a structural schematic view of a color filter substrate according to further another embodiment of the present disclosure.

FIG. 6 is a flow chart of a first preparing method of a color filter substrate according to one embodiment of the present disclosure.

Figure 7:
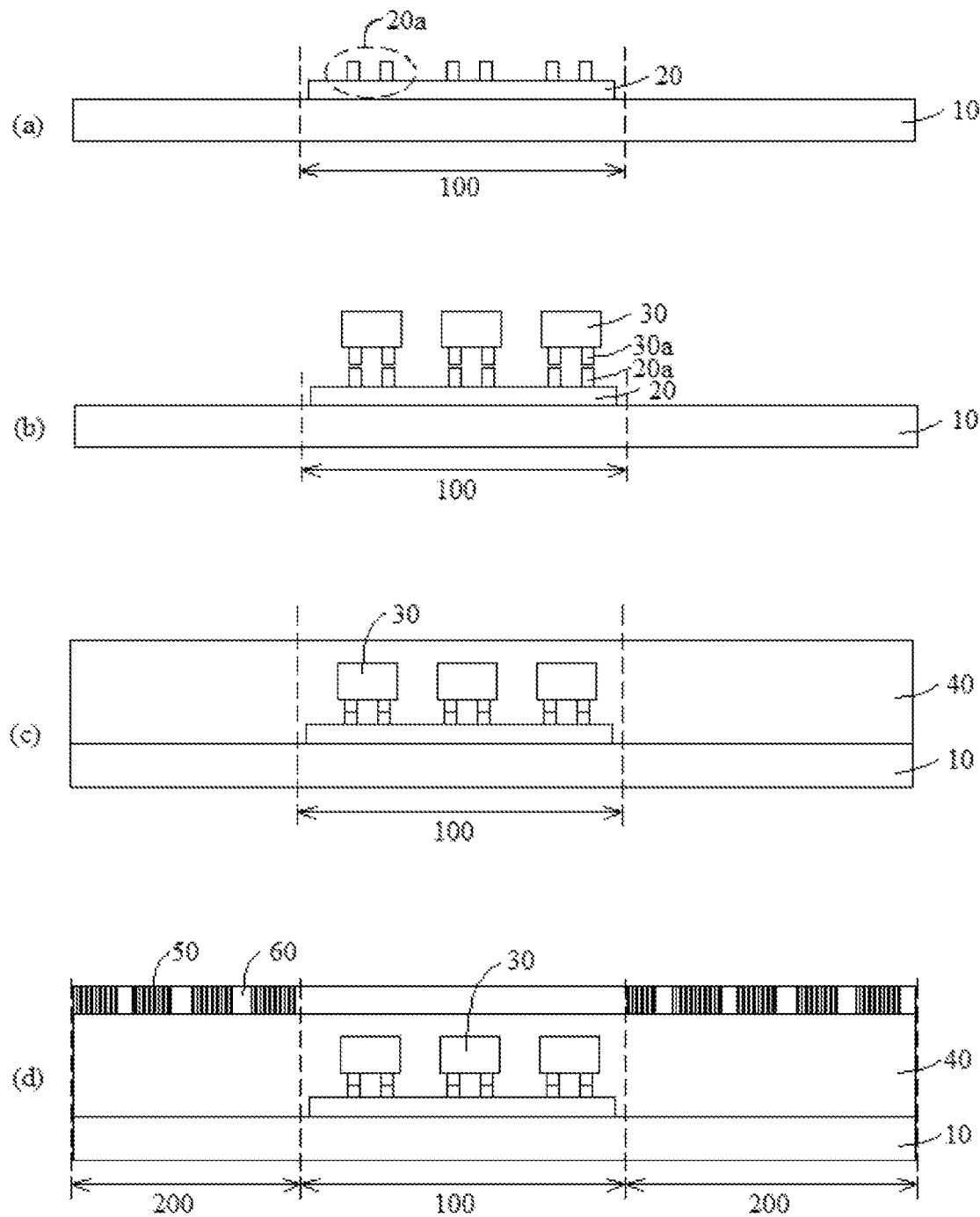

FIG. 7 is a schematic diagram of a first preparing method of a color filter substrate according to the present disclosure.

Figure 8:
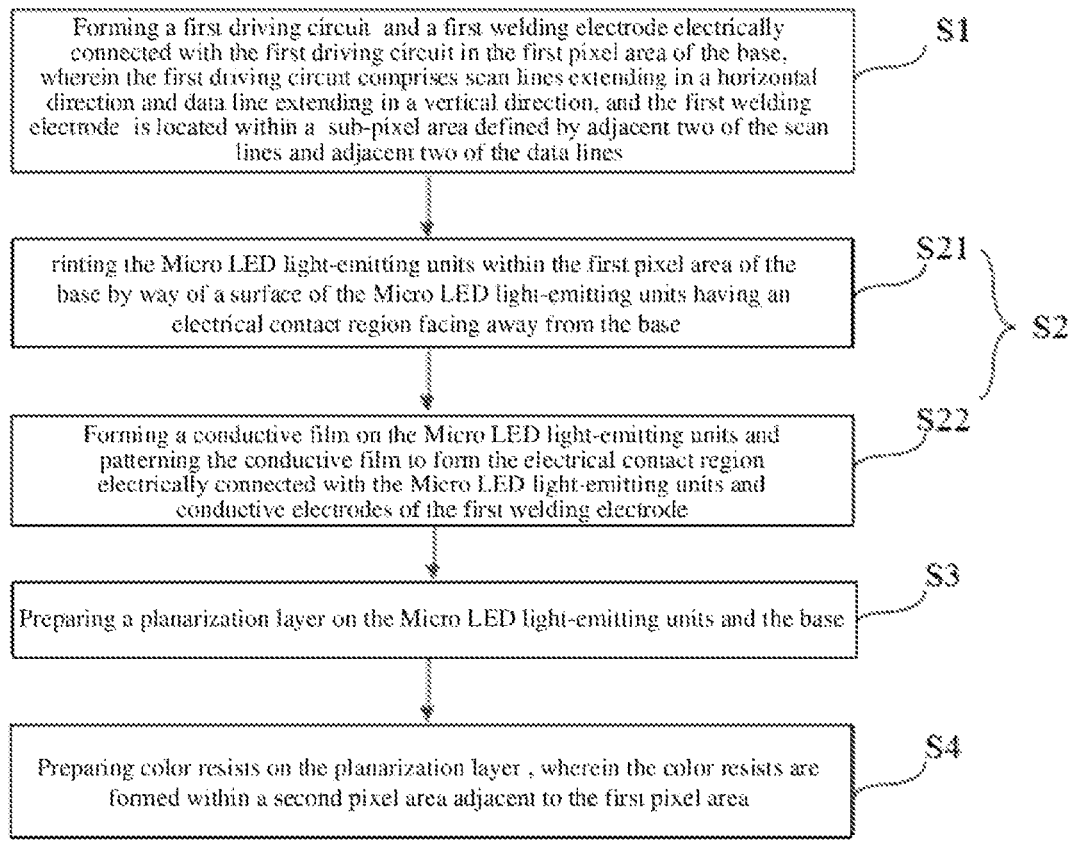

FIG. 8 is a flow chart of a second preparing method of a color filter substrate according to one embodiment of the present disclosure.

Figure 9:
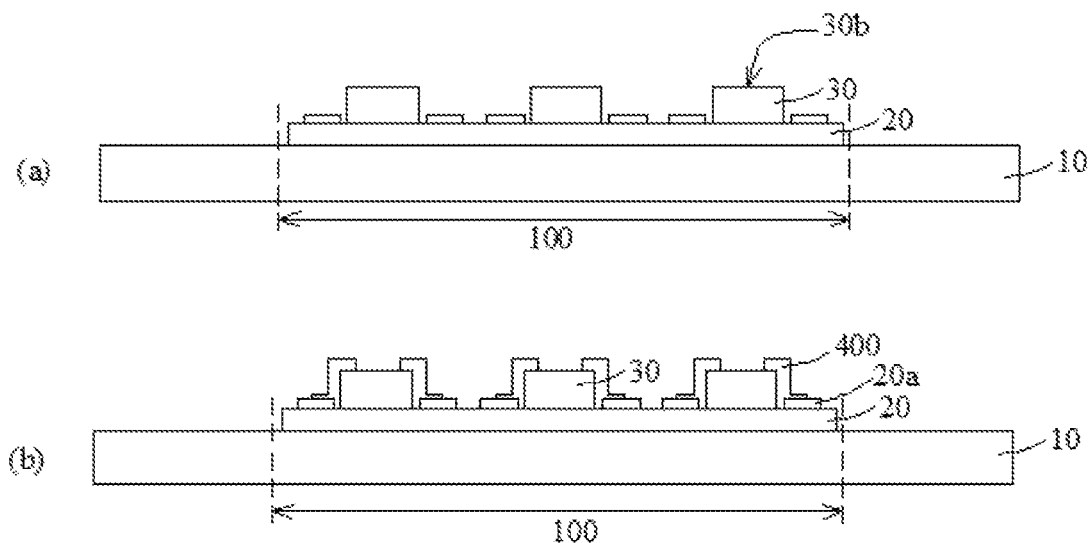

FIG. 9 a schematic diagram of a second preparing method of a color filter substrate according to the present disclosure.

Figure 10:
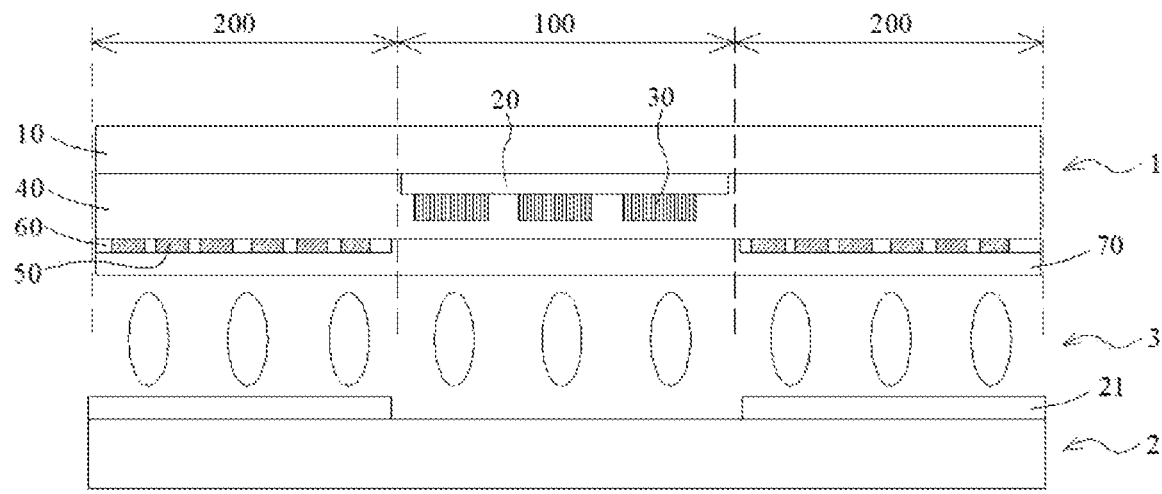

FIG. 10 is a structural schematic view of a display panel according to one embodiment of the present disclosure.

Figure 11:
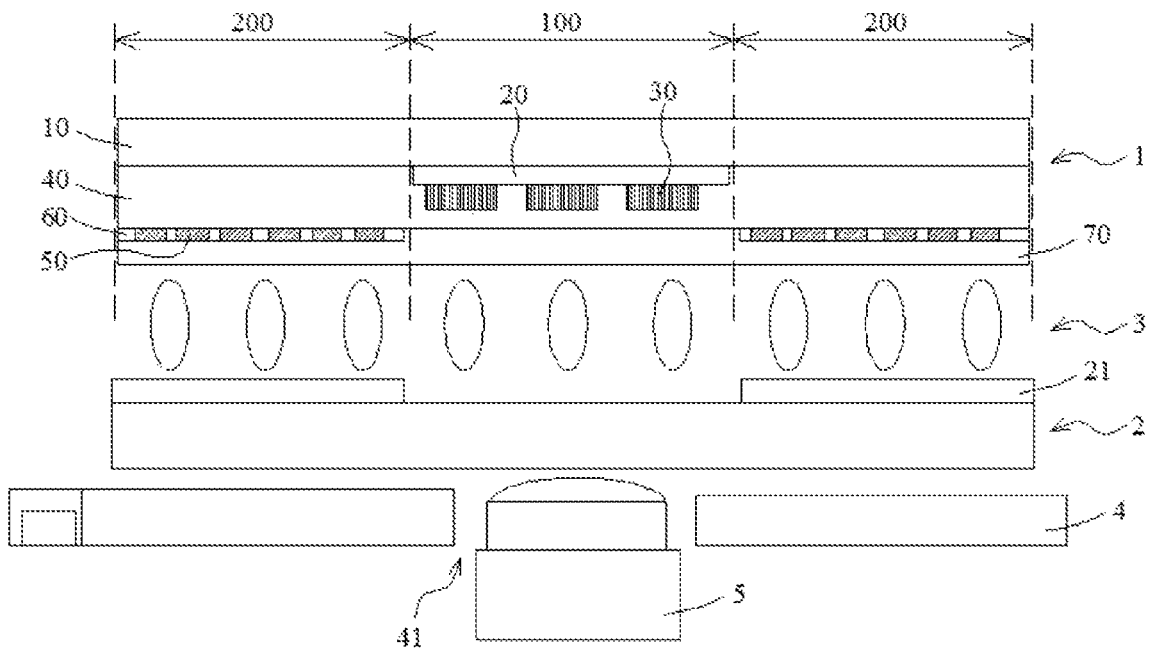

FIG. 11 is a structural schematic view of a display device according to one embodiment of the present disclosure.

DESCRIPTION OF PREFERRED EMBODIMENTS OF INVENTION

The technical solutions in embodiments of the present disclosure will be described clearly and completely in conjunction with the drawings in the embodiments of the present disclosure. Apparently, the described embodiments are only a part of the embodiments of the present disclosure, but not all of the embodiments. Based on the embodiments in the present disclosure, other embodiments obtained by those skilled in the art without creative work would fall within the protection scope of the present disclosure.

In the description of the present disclosure, it should be understood that the terms "longitudinal", "lateral", "length", "width", "upper", "lower", "front", "back", "left", "right", "vertical", "horizontal", etc., for indicating orientation or position are based on the orientation or position shown in the drawings, which are merely for the convenience of describing the present disclosure and simplifying the description, rather than for indicating or implying that the devices or elements referred to must have a specific orientation or should be constructed and operated with specific position, and thus cannot be understood as a limitation of the present disclosure. Moreover, the terms "first" and "second" are used for description only, and cannot be understood as indicating or implying relative importance, or the number of technical features indicated. Thus, features defined as "first" and "second" may explicitly or implicitly include one or more of the features. In the description of the present disclosure, "multiple" means two or more than two, unless it is specifically defined. In this disclosure, "l" means "or".

This application may use repeated reference numbers and/or reference letters in different embodiments. This repetition is for the purpose of simplification and clarity, and does not indicate the relationship between the various embodiments and/or configurations discussed.

In the field of small and medium-sized displays, full-screen technology has become the current focus of research and development. Current mainstream display technologies include liquid crystal display (LCD) technology and organic light-emitting diodes (OLED) technology, wherein the LCD technology is a passive light-emitting technology, and an entire backlight structure illuminates a liquid crystal cell to realize brightness control of optical fibers, while the OLED technology uses OLED pixel to actively emit light. By comparison, the OLED has the advantages of high contrast, thinness, flexibility, foldability, etc., and is well compatible with current optical fingerprint recognition modules, so in-plane optical sensing technology has become the "unique advantages" of the current OLED screens. On the contrary, the low-cost advantage of LCD screens seems precarious.

Accordingly, a primary object of the present disclosure is to provide a color filter substrate and a method of preparing the same, a display panel, and a display device, in order to solve the problem that the optical sensors cannot overlap the optical display spatially in conventional LCD screens, so that the LCD screens cannot meet people's extreme requirement of full-screen display.

In addition, compared with the OLED technology, micro light-emitting diodes have similar active lighting characteristics, and due to good stability, and high efficiency, inorganic LED itself has advantages of ling life, high brightness, small chip size, and long response time. However, compared with traditional panel technology, panels are produced by "subtractive manufacturing" methods, such as etching, but the Micro LED mainly relies on "additive manufacturing" method of mass-transfer that has a lower technological maturity, and especially the mass transfer of the display pixels has inherent manufacturing yield and cost challenges.

Accordingly, another object of the present disclosure is to provide a color filter substrate, a method of preparing the same, a display panel, and a display device, in order to solve the problems of low process yields and high costs due to massive transfer when the Micro LED is applied to display technology, which limits the application of the Micro LED in display technology.

In addition, when the Micro LED is applied in display technology, a bonding technology of the Micro LED and the substrate is involved. However, since overall height of the Micro LED and the substrate after bonding is greater than a cell gap of the small and medium-sized LCD (that is, the gap between an array substrate and a color filter substrate), incell integration of the Micro LED display technology is difficult to be realized.

Accordingly, another object of the present disclosure is to provide a color filter substrate, a method of preparing the same, a display panel, and a display device, to solve the problems caused by processes of binding Micro LEDs to the substrate, so that incell integrated Micro LED display technology is difficult to be realized.

A color filter substrate and a method of preparing the same, a display panel and a display device of the present disclosure will be described in detail below with reference to specific embodiments.

Referring to FIG. 1, which shows top views of various types of color filter substrates provided by embodiments of the present disclosure. The present disclosure provides a color filter substrate, including a first pixel area 100 and a second pixel area 200 adjacent to the first pixel area 100, wherein the first pixel area 100 is a Micro LED display area, and the second pixel area 200 is a liquid crystal display area. The first pixel area 100 and the second pixel area 200 seamlessly connect, so that there is no display interruption and discontinuous boundaries in vision. Therefore, a complete full screen design can be reached. In addition, since Micro LEDs have characteristics of high brightness and long life, part of Micro LED light-emitting units in the first pixel area 100 can serve as fill light and indicator light.

Please refer to (a)-(e) of FIG. 1 in combination with FIG. 2, a color filter substrate of the present disclosure includes: a base 10 located within the first pixel area 100 and the second pixel area 200; a plurality of Micro LED light-emitting units 30 disposed on the base 10 corresponding to the first pixel area 100, wherein a transparent area is disposed between the Micro LED light-emitting units 30; a planarization layer 40 disposed on the Micro LED light-emitting units 30 and the base 10; color resists 50 disposed on the planarization layer 40 corresponding to the second pixel area 200.

Since the color filter substrate of the present disclosure adopts a micro light-emitting diode display technology in combination with a liquid crystal display technology, the optimal full-screen display of LCD can be realized. Furthermore, since the color filter substrate has a transparent area between adjacent two of the Micro LED light-emitting units 30 for allowing light passing therethrough, the incell integration can be achieved within the first pixel area 100. In addition, the present disclosure provides a technical solution that the Micro LED light-emitting units 30 are integrated inside the color filter substrate and planarized by the planarization layer 40. Therefore, the bonding process of the Micro LED light-emitting units does not affect cell formation of the color filter substrate and an array substrate, so that the incell integrated Micro LED display can be achieved.

Referring to FIG. 2, a color filter substrate provided by one embodiment of the present disclosure is described in detail. The color filter substrate includes: a base 10, wherein the base 10 may be a glass substrate with good transmittance, or a flexible substrate; a first driving circuit 20, wherein the first driving circuit 20 is disposed on the base 10 corresponding to the first pixel area 100 for providing the Micro LED light-emitting units 30 a driving signal so that the Micro LED light-emitting units 30 can emit light; a plurality of Micro LED light-emitting units 30 disposed on the base 10 corresponding to the first pixel area 100, wherein the Micro LED light-emitting units 30 are electrically connected with the first driving circuit 20; a planarization layer 40 disposed on the Micro LED light-emitting units 30 and the base 10. The planarization layer 40 is used for planarizing a surface of the base having the Micro LED light-emitting units 30. A plurality of color resists 50 are disposed on the planarization layer 40 corresponding to the second pixel area 200, and a black matrix 60 is provided between adjacent two of the color resists 50. A protection layer 70 may be disposed on the color resists 50 and the black matrix 60. The protection layer 70 can flatten the surface of the color filter substrate, and furthermore can protect the film layer covered thereby from damage.

It is characterized that the first driving circuit 20 includes scan lines (not shown) extending in a horizontal direction and data lines (not shown) extending in a longitudinal direction. Adjacent two of the scan lines and adjacent two of the data lines define a sub-pixel area. The scan lines and the data lines may also extend to the second pixel area 200. It can be understood that a portion of the scan lines and a portion of the data lines extending to the second pixel area 200 are disposed away from the color resists 50 in order not to affect the pixel display in the second pixel area 200. That is, the portions of the scan lines and the data lines correspond to the position of the black matrix 60.

In one embodiment, the first driving circuit 20 may adopt active matrix (AM) driving technology that the first driving circuit 20 further comprises thin film transistors (not shown). Each of the Micro LED light-emitting units 30 is electrically connected with the corresponding scan lines and the corresponding data lines through the corresponding thin film transistor, respectively.

In this embodiment, to ensure the transmittance of the first pixel area 100, the first driving circuit 20 adopts a passive matrix (PM) driving technology that the first driving circuit 20 does not have thin film transistors.

In this embodiment, the Micro LED light-emitting units 30 is three-color display. That is, the Micro LED light-emitting units 30 comprises a red light-emitting unit, a green light-emitting unit, and a blue light-emitting unit. The size of the Micro LED light-emitting units 30 is 1 µm to 100 µm, and a height of the Micro LED light-emitting units 30 is 1 µm to 20 µm. It is characterized that the Micro LED light-emitting units 30 may have a structure that light emits from the base surface or from the electrode surface, which are not limited thereto.

In another embodiment, the Micro LED light-emitting units 30 use a blue display in combination with a color conversion technology. That is, the red light-emitting unit comprises a blue light-emitting unit and a color conversion layer disposed on the blue light-emitting units. The color conversion layer can convert the blue light emitted by the blue light-emitting unit into red light. The green light-emitting unit comprises a blue light-emitting unit and a color conversion layer disposed on the blue light-emitting unit. The color conversion layer can convert the blue light emitted by the blue light-emitting unit into green light. It is characterized that the color conversion layer is a quantum dot film or a fluorescent powder, but is not limited thereto.

Refer to FIG. 3, which shows a schematic view of the color filter substrate having Micro LED light-emitting units provided by the embodiment of the present disclosure. Since the Micro LED light-emitting units 30 have an advantage of small size, an area of an orthographic projection of each of the Micro LED light-emitting units 30 projected on the base is smaller than an area of the sub-pixel area P, so that a transparent area 300 is disposed between the Micro LED light-emitting units 30.

Furthermore, an area of an orthographic projection of each of the Micro LED light-emitting units 30 projected on the base ranges from 10% to 50% of an area of the sub-pixel area P.

In the case that the first pixel area 100 can realize normal display, and since the coverage area of each of the Micro LED light-emitting units 30 is smaller than the area of each of the sub-pixel area P, the light can pass normally through the sub-pixel area P not covered by the Micro LED light-emitting units 30. The first pixel area 100 can collect external images to enter the under-screen sensor by turning off the Micro LED light-emitting units 30. In this way, various under-screen sensing solutions, such as under-screen fingerprint recognition, under-screen camera, under-screen recognition, and under-screen distance perception can be realized.

Referring to FIG. 2, the planarization layer 40 is disposed on the entire surface of the first pixel area 100 and the second pixel area 200. Materials of the planarization layer 40 include but not limit to organic resins, OC resins, and silicone. The materials of the planarization layer 40 have a good temperature resistance, good adhesion, and good light transmission. The planarization layer 40 has a thickness ranging from 3 µm to 200 µm to fill the gaps formed by the bonding process of the Micro LED light-emitting units 30 on the base.

Furthermore, the Micro LED light-emitting units 30 generally have a height ranging from 11 µm to 20 µm, so that a thickness of the planarization layer may range from 3 µm to 100 µm for ensuring the lightness and the thinness while taking into account the flatness of the color filter substrate.

It is characterized that a thickness of a portion of the planarization layer 40 corresponding to the Micro LED light-emitting units 30 is smaller than a thickness of a portion of the planarization layer 40 not corresponding to the Micro LED light-emitting units 30.

Furthermore, the thickness of the portion of the planarization layer 40 corresponding to the Micro LED light-emitting units 30 is 2 µm to 80 µm. Thus, the planarization layer 40 may completely cover the Micro LED light-emitting units 30.

It is characterized that a surface of the planarization layer 40 away from the base 10 is a flat surface, and therefore the configuration of the planarization layer 40 effectively solves the problems of large gaps caused by the bonding technology of the Micro LED light-emitting units 30 that make the Micro LED display technology difficult to achieve incell integration.

In order not to affect the light transmittance of the first pixel area 100, the transmittance of the planarization layer 40 is greater than or equal to 70%.

Furthermore, a transmittance of the planarization layer 40 is greater than or equal to 85%.

In this embodiment, the color resists 50 and the black matrix 60 are not disposed in the first pixel area 100. The protection layer 70 is disposed within the first pixel area 100 and the second pixel area 200. It is characterized that a surface of the protection layer 70 away from the base 10 is a flat surface. In this way, the integration of Micro LED display technology in the color filter substrate is realized. Moreover, since the surface of the color filter substrate for alignment with the array substrate is a flat surface, the binding of the Micro LED light-emitting units 30 of the present disclosure does not affect the cell gap of the small and medium-sized LCDs.

In other embodiment, the planarization layer 40 may be a multilayer structure. Referring to FIG. 4, it shows a structural schematic view of a color filter substrate provided by another embodiment of the present disclosure. The color filter substrate in FIG. 4 has same/similar structure as the color filter substrate in FIG. 2, but the difference is that the planarization layer 40 of the color filter substrate in FIG. 4 includes a first sub-planarization layer 401 and a second sub-planarization layer 402. The first sub-planarization layer 401 is filled within adjacent two of the Micro LED light-emitting units 30, and the second sub-planarization layer 402 is disposed on the Micro LED light-emitting units 30 and the first sub-planarization layer 401. A surface of the second sub-planarization layer 402 away from the Micro LED light-emitting units 30 is a flat surface. Since the first sub-planarization layer 401 fills the gap between the Micro LED light-emitting units 30 and the base 10, and thus the flatness of the formed second sub-planarization layer 402 can be further guaranteed.

Referring to FIG. 5, it shows a structural schematic view of a color filter substrate provided by another embodiment of the present disclosure. The color filter substrate in FIG. 5 has same/similar structure as the color filter substrate in FIG. 4, but the difference is that the planarization layer 40 of the color filter substrate in FIG. 5 includes a third sub-planarization layer 403 and the third sub-planarization layer 403 is disposed on a side of the color resists 50 away from the base 10. It is characterized that a surface of the third sub-planarization layer 403 away from the base 10 is a flat surface and the protection layer 70 is disposed on the surface of the third sub-planarization layer 403. Since the third sub-planarization layer 403 fills the gap between the color resists 50 the planarization layer 40, and thus the flatness of the formed protection layer 70 can be further guaranteed.

Since the Micro LED light-emitting units 30 are disposed only in the first pixel area 100 of the color filter substrate according to the present disclosure, and the first pixel area 100 has small area proportion so that it does not need a massive transfer. In this way, it can not only realize the application of Micro LED display technology in the display panel/display device, but also solve the problems of low process yield and high cost when a large number of display pixels are transferred.

The present disclosure further provides a method of preparing the above color filter substrate. Please refer to FIG. 6, the method comprises below steps:

Step S1: Referring to (a) in FIG. 7, forming a first driving circuit 20 and a first welding electrode 20a electrically connected with the first driving circuit 20 in the first pixel area 100 of the base 10. The first driving circuit 20 comprises scan lines extending in a horizontal direction and data line extending in a vertical direction. The first welding electrode 20a is located within a sub-pixel area defined by adjacent two of the scan lines and adjacent two of the data lines.

It is characterized that the first welding electrode 20a comprises an N electrode and a P electrode opposite to the N electrode.

Step S2: Referring to (b) in FIG. 7, transferring the Micro LED light-emitting units 30 to the first pixel area 100 of the base 10 by printing, and electrically binding a second welding electrode 30a on the Micro LED light-emitting units 30 and the first welding electrode 20a.

It is characterized that the second welding electrode 30a includes an N electrode and a P electrode opposite to the N electrode. In the bonding process, the N electrode of the Micro LED light-emitting units 30 electrically connects the N electrode on the base 10, and the P electrode of the Micro LED light-emitting units 30 electrically connects the P electrode on the base 10.

Step S3: Referring to (c) in FIG. 7, preparing a planarization layer 40 on the Micro LED light-emitting units 30 and the base 10.

It is characterized that the planarization layer 40 is capable of filling the gap between the Micro LED light-emitting units 30 and the base 10, and a surface of the planarization layer 40 away from the base 10 is a flat surface.

Step S4: Referring to (d) in FIG. 7, preparing color resists 50 on the planarization layer 40, wherein the color resists 50 are formed within a second pixel area 200 adjacent to the first pixel area 100.

It is characterized that the method further comprises steps of preparing a black matrix 60 in the second pixel area 200, wherein the black matrix 60 is located between adjacent two of the color resists 50. The preparation order of the color resists 50 and the black matrix 60 is not limited. Next, a protection layer is formed on the color resists 50.

Since the color filter substrate of the present disclosure is prepared by forming the first driving circuit on the base and binding the Micro LED light-emitting units firstly, and then the color resists and the black matrix are formed. Therefore, the material characteristics of the color resists can be guaranteed to be not affected by the high temperature process in the manufacturing process of the first driving circuit and the bonding process of the Micro LED light-emitting units.

In another embodiment of the present disclosure, a method of preparing a color filter substrate is provided. As shown in FIG. 8, the difference between the method of the above color filter substrate and the method of this embodiment is merely the step S2. The step S2 in this embodiment further comprises two steps specifically as shown in below:

Step S21: Referring to (a) in FIG. 9, printing the Micro LED light-emitting units 30 within the first pixel area 100 of the base 10 by way of a surface 30b of the Micro LED light-emitting units 30 having an electrical contact region facing away from the base 10.

Step S22: Referring to FIG. 9, forming a conductive film on the Micro LED light-emitting units 30 and patterning the conductive film to form the electrical contact region electrically connected with the Micro LED light-emitting units 30 and conductive electrodes 400 of the first welding electrode 20a.

It is characterized that the electrical contact region comprises an N contact region and a P contact region disposed opposite the N contact region. One of the conductive electrodes 400 electrically connects the N contact region and an N electrode on the base 10, and another one of the conductive electrodes 400 electrically connects the P contact region and a P electrode on the base 10.

Since the color filter substrate of the present disclosure is prepared by forming the first driving circuit on the base and binding the Micro LED light-emitting units firstly, and then the color resists and the black matrix are formed. Therefore, the material characteristics of the color resists can be guaranteed to be not affected by the high temperature process in the manufacturing process of the first driving circuit and the bonding process of the Micro LED light-emitting units. In addition, since the Micro LED light-emitting units do not have traditional welding electrodes in the bonding process according to this embodiment, thus the height of the Micro LED light-emitting units may be reduced after the bonding process.

The present disclosure further provides a display panel. As shown in FIG. 10, the display panel comprises the abovementioned color filter substrate 1, the array substrate 2, and the liquid crystal layer 3 between the color filter substrate 1 and the array substrate 2. It is characterized that the array substrate 2 is provided with the second driving circuit 21, and the second driving circuit 21 is disposed within the second display area 200. Since the first pixel area 100 corresponding to the display panel is not provided with the second driving circuit 21, and therefore the transmittance of the first pixel area 100 is not affected.

The present disclosure further provides a display device. As shown in FIG. 11, the display device comprises the abovementioned display panel, a backlight module 4, and a sensor component 5. The backlight module 4 has a through via 41 corresponding to the first pixel area 100, and the sensor component 5 is directly opposite the through via 41.

It is characterized that the sensor component 5 is an optical sensor capable of facial recognition, sensing distance, fingerprint recognition, etc., and is not limited thereto.

As such, the color filter substrate and the method of preparing the color filter substrate, the display panel, and the display device provided by the present disclosure can achieve excellent full-screen display through the use of a Micro LED display technology in combination with a liquid crystal display technology. Furthermore, since the color filter substrate has a transparent area located between adjacent two of the Micro LED light-emitting units, the transparent area allows light to pass therethrough, so as to realize incell sensor integration. In addition, the present disclosure provides a technical solution that the Micro LED light-emitting units are integrated inside the color filter substrate and planarized by the planarization layer. Therefore, the bonding process of the Micro LED light-emitting units does not affect cell formation of the color filter substrate and an array substrate, so that the incell integrated Micro LED display can be achieved.

In summary, although the present invention has been described with preferred embodiments thereof, the present invention is not limited thereto. It is understood that many changes and modifications to the described embodiments can be carried out by the skilled person in the art without departing from the scope and the spirit of the invention that is intended to be limited only by the appended claims.

What is claimed is:

1. A color filter substrate, comprising a first pixel area and a second pixel area adjacent to the first pixel area, wherein the color filter substrate comprises:
   a base;
   a plurality of micro light emitting diode (Micro LED) light-emitting units disposed on the base corresponding to the first pixel area, wherein a transparent area is disposed between the Micro LED light-emitting units;
   a planarization layer disposed on the Micro LED light-emitting units and the base; and
   color resists disposed on the planarization layer corresponding to the second pixel area,
   wherein the color filter substrate further comprises a first driving circuit which corresponds to the first pixel area and is disposed on a surface of the base facing the Micro LED light-emitting units, and the Micro LED light-emitting units are electrically connected with the first driving circuit, and
   wherein the first driving circuit comprises scan lines extending in a horizontal direction and data lines extending in a longitudinal direction, adjacent two of the scan lines and adjacent two of the data lines define a sub-pixel area, and an area of an orthographic projection of each of the Micro LED light-emitting units projected on the base is smaller than an area of the sub-pixel area.

2. The color filter substrate according to claim 1, wherein a surface of the planarization layer away from the base is a flat surface, the color filter substrate further comprises a protection layer disposed on the color resists and the planarization layer, and a surface of the protection layer away from the base is a flat surface.

3. The color filter substrate according to claim 2, wherein the planarization layer comprises a first sub-planarization layer and a second sub-planarization layer, the first sub-planarization layer is filled between adjacent two of the Micro LED light-emitting units, the second sub-planarization layer is disposed on the Micro LED light-emitting units and the first sub-planarization layer, a surface of the second sub-planarization layer away from the Micro LED light-emitting units is a flat surface.

4. The color filter substrate according to claim 3, wherein a side of the color resists away from the base is provided with a third sub-planarization layer, a surface of the third sub-planarization layer away from the base is a flat surface, and the protection layer is disposed on the surface of the third sub-planarization layer.

5. The color filter substrate according to claim 1, wherein a thickness of the planarization layer ranges from 3 microns to 100 microns.

6. The color filter substrate according to claim 1, wherein a transmittance of the planarization layer is greater than or equal to 70%.

7. The color filter substrate according to claim 1, wherein the color filter substrate further comprises a first welding electrode electrically connecting the first driving circuit, and the first welding electrode is located within the sub-pixel area.

8. The color filter substrate according to claim 1, wherein an area of an orthographic projection of each of the Micro LED light-emitting units projected on the base ranges from 10% to 50% of an area of the sub-pixel area; the Micro LED light-emitting units comprise a red light-emitting unit, a green light-emitting unit, and a blue light-emitting unit.

9. The color filter substrate according to claim 8, wherein the red light-emitting unit comprises a blue light-emitting unit and a color conversion layer disposed on the blue light-emitting unit, and the green light-emitting unit comprises a blue light-emitting unit and a color conversion layer on the blue light-emitting unit, and the color conversion layer is a quantum dot film or a fluorescent powder.

10. The color filter substrate according to claim 1, wherein the first driving circuit further comprises thin film transistors, each of the Micro LED light-emitting units electrically connects the corresponding scan lines and the corresponding data lines, respectively, through the corresponding thin film transistors.

11. The color filter substrate according to claim 1, wherein the first pixel area is a Micro LED display area, and the second pixel area is a liquid crystal display area.

12. The color filter substrate according to claim 1, wherein the color filter substrate further comprises a black matrix disposed on the planarization layer corresponding to the second pixel area, and located between adjacent two of the color resists.

13. The color filter substrate according to claim 12, wherein a protection layer is disposed on the color resists and the black matrix.

14. The color filter substrate according to claim 13, wherein the protection layer is disposed within the first pixel area and the second pixel area, and a surface of the protection layer away from the base is a flat surface.

15. A display panel, comprising a color filter substrate according to claim 1.

16. A display device, comprising a color filter substrate according to claim 1.

* * * * *